United States Patent
Terrovitis

(10) Patent No.: US 7,508,264 B1
(45) Date of Patent: Mar. 24, 2009

(54) DC-COUPLES RF MULTI-STAGE AMPLIFIER

(75) Inventor: Manolis Terrovitis, Santa Clara, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 19 days.

(21) Appl. No.: 11/279,860

(22) Filed: Apr. 14, 2006

(51) Int. Cl.
    *H03F 3/45* (2006.01)
(52) U.S. Cl. .................. 330/253; 330/310; 330/260
(58) Field of Classification Search .............. 330/253, 330/258–260
    See application file for complete search history.

(56) References Cited

U.S. PATENT DOCUMENTS 6,956,436 B2 * 10/2005 Li et al. ................ 330/258
7,109,799 B2 * 9/2006 Yin et al. ................ 330/260
7,292,099 B2 * 11/2007 Stoger et al. ............ 330/253

* cited by examiner

*Primary Examiner*—Robert Pascal
*Assistant Examiner*—Hieu P Nguyen
(74) *Attorney, Agent, or Firm*—Bever, Hoffman & Harms, LLP; Jeanette S. Harms

(57) ABSTRACT

An RF amplifier can include multiple gain stages, wherein each gain stage can be DC coupled to an adjacent gain stage. Each input gain stage can include either n-type gain transistors or p-type gain transistors. Multiple input gain stages can be designed/built by interleaving input gain stages of different types. Notably, an input gain stage including n-type gain transistors has a p-type bias transistor. Similarly, an input gain stage including p-type gain transistors has an n-type bias transistor. In this configuration, the bias transistor is the same type as the downstream gain transistors. Therefore, each bias transistor can accurately track the behavior of the transconductance devices of the next gain stage.

17 Claims, 4 Drawing Sheets

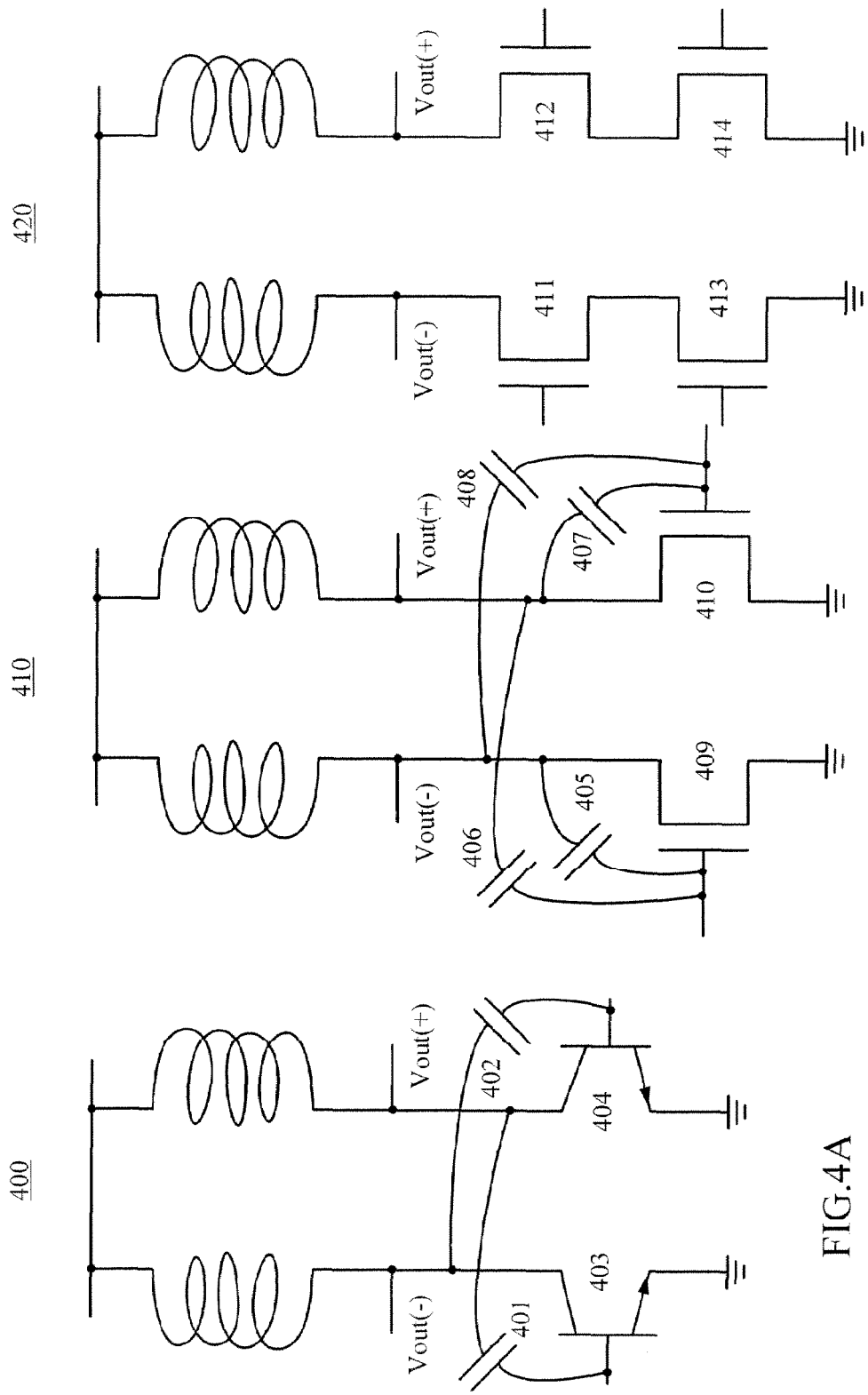

DC-COUPLES RF MULTI-STAGE AMPLIFIER

BACKGROUND OF THE INVENTION

1. Field of the Invention

The present invention relates to a multi-stage radio frequency (RF) amplifier and in particular to a multi-stage RF amplifier with DC coupled RF gain stages.

2. Related Art

FIG. 1 illustrates a conventional two-stage CMOS RF amplifier 100 that uses AC coupling between the RF gain stages. In RF amplifier 100, a first gain stage 111 includes an inductor 101 and an NMOS transistor 103 connected in series between a first voltage source VDD and a second voltage source VSS. Transistor 103 receives the positive differential input signal Vin(+) on its gate. First gain stage 111 further includes an inductor 102 and an NMOS transistor 104 connected in series between first voltage source VDD and second voltage source VSS. Transistor 104 receives the negative differential input signal Vin(−) on its gate.

In RF amplifier 100, a second gain stage 112 includes an inductor 106 and an NMOS transistor 108 connected in series between first voltage source VDD and second voltage source VSS. Node 115, which is located between inductor 106 and transistor 108, provides the negative differential output signal Vout (−). Second gain stage 112 further includes an inductor 107 and an NMOS transistor 109 connected in series between first voltage source VDD and second voltage source VSS. Node 116, which is located between inductor 107 and transistor 109, provides the positive differential output signal Vout (+).

The gate of transistor 108 is connected to node 114 (which is located between inductor 102 and transistor 104) via a capacitor 105. Similarly, the gate of transistor 109 is connected to node 113 (which is located between inductor 101 and transistor 103) via a capacitor 110. Capacitors 105 and 110 provide AC coupling between gain stages 111 and 112.

Notably, the load being driven by each gain stage can be characterized as capacitive. Inductors 101 and 102 can be used to tune out such capacitance. Using resistive elements instead of inductors would not permit the RF amplifier to drive the load with sufficient amplitude at high frequencies. Because the frequency of operation is represented by $$f = 1/2\pi\sqrt{LC} \qquad \text{Equation 1}$$

wherein L is the inductance of an inductor and C is the capacitance of the load, then the inductance of each inductor can be computed by $$L = 1/C(2\pi f)^2 \qquad \text{Equation 2}$$

Note that gain stages 111 and 112 can be biased independently, typically through high value resistors, which can be connected to nodes between capacitors 105/110 and the gates of transistors 108/109. In FIG. 1, one such high value resistor 120 is shown coupled between a node 124 and a bias node 121. Bias node 121 can be biased with a voltage provided by a constant current source 123 and a transistor 122, which are connected in series between VDD and VSS. The gate and the drain of transistor 122 are connected to both bias node 121 and current source 123. In this configuration, at a jigh frequency, the resistance of resistor 120 is much higher than the impedance of capacitor 105, thereby effectively negating the loss due to the biasing elements. Note that similar biasing elements can be connected to a node between capacitor 110 and the gate of transistor 109.

Unfortunately, the AC coupling capacitors (i.e. capacitors 105 and 110) introduce parasitic capacitance at one or both of its terminals. Because of this extra parasitic capacitance, smaller tuning inductors (i.e. inductors 101, 102, 106, and 107) must be used, which can result in lower gain for RF amplifier 100. In addition, the input parasitic capacitance associated with second gain stage 112 forms a voltage divider with the AC coupling capacitors (i.e. capacitors 105 and 110), which can result in further gain reduction of RF amplifier 100. When second gain stage 112 is large and has large input capacitance (particularly the case between the gain stages of an on-chip high-power RF amplifier), the performance of RF amplifier 100 suffers significantly because of the above-described parasitic capacitance and voltage divider configuration. To satisfy a normal gain requirement under such conditions, extra power needs to be consumed. Moreover, the AC coupling capacitors are usually large devices, thereby using significant silicon area.

Therefore, a need arises for an RF amplifier that eliminates the AC coupling between its gain stages, thereby improving performance and saving silicon area.

SUMMARY OF THE INVENTION

In accordance with one aspect of the invention, an RF amplifier can include multiple RF gain stages, wherein each gain stage can be DC coupled to an adjacent gain stage. Each input gain stage can include n-type gain transistors or p-type gain transistors. Advantageously, multiple input gain stages can be designed/built by interleaving input gain stages including p-type gain transistors and input gain stages including n-type gain transistors.

Notably, an input gain stage including n-type gain transistors has a p-type bias transistor. Similarly, an input gain stage including p-type gain transistors has an n-type bias transistor. In this configuration, the bias transistor is the same type as the downstream gain transistors. Therefore, each bias transistor can accurately track the behavior of the transconductance devices of the next gain stage.

In one embodiment, the RF amplifier can include N gain stages. The Nth gain stage of this RF amplifier can include first and second inductors as well as first and second gain transistors. The first inductor and the first gain transistor can be connected in series between a first voltage source and a second voltage source. The second inductor and the second transistor can be connected in series between the first voltage source and the second voltage source.

The N−1 gain stage can include third and fourth gain transistors, third and fourth inductors, and a first bias transistor. The third gain transistor and the third inductor can be connected in series between the first voltage source and a first bias node. The fourth gain transistor and the fourth inductor can be connected in series between the first voltage source and the first bias node. The first bias transistor can be connected between the first bias node and the second voltage source, wherein the gate of the first bias transistor is also connected to the first bias node.

Notably, the first gain transistor, the second gain transistor, and the first bias transistor can be n-type transistors, whereas the third and fourth gain transistors can be p-type transistors. A first node between the first inductor and the first gain transistor can provide the negative differential output signal of the RF amplifier, whereas a second node between the second inductor and the second gain transistor can provide the positive differential output signal of the RF amplifier.

In accordance with one aspect of the invention, a third node between the third gain transistor and the third inductor can directly drive a gate of the first gain transistor, whereas a fourth node between the fourth gain transistor and the fourth inductor can directly drive a gate of the second gain transistor. Note that if N=2, then the positive differential input signal of the RF amplifier can be provided to the gate of the third gain transistor and the negative differential input signal of the RF amplifier can be provided to the gate of the fourth gain transistor.

The RF amplifier can further include an N−2 gain stage. The N−2 gain stage can include fifth and sixth inductors, fifth and sixth gain transistors, and a second bias transistor. The fifth inductor and fifth gain transistor can be connected in series between the second bias node and the second voltage source. The sixth inductor and the sixth gain transistor can be connected in series between the second bias node and the second voltage source. The second bias transistor can be connected between the second bias node and the first voltage source, wherein the gate of the second bias transistor can also be connected to the second bias node. Notably, in the N−2 gain stage, the fifth gain transistor and the sixth gain transistor can be n-type transistors, whereas the second bias transistor can be a p-type transistor.

In accordance with another aspect of the invention, a fifth node between the fifth inductor and the fifth gain transistor can directly drive a gate of the third gain transistor, whereas a sixth node between the sixth inductor and the sixth gain transistor can directly drive a gate of the fourth gain transistor. Note that if N=3, then the positive differential input signal of the RF amplifier can be provided to the gate of the fifth gain transistor and the negative differential input signal of the RF amplifier can be provided to the gate of the sixth gain transistor. Additional gain stages to the RF amplifier can advantageously alternate between the inductor/transistor configurations associated with the N−1 gain stage and the N−2 gain stage.

BRIEF DESCRIPTION OF THE FIGURES

FIGS. 4A-4C illustrate various RF amplifier output gain stages that can cancel parasitic capacitive feedback associated with its gain transistors, thereby ensuring stability in high frequency applications.

DETAILED DESCRIPTION OF THE FIGURES

Conventional RF amplifiers use AC coupling between gain stages. This AC coupling introduces undesirable parasitic capacitance at one or both terminals of the gain stage. Unfortunately, such parasitic capacitance significantly lowers amplifier gain.

In accordance with one aspect of the invention, an RF amplifier can include multiple RF gain stages, wherein each gain stage can be DC coupled (not AC coupled) to an adjacent gain stage. Each input gain stage can include either n-type gain transistors or p-type gain transistors. Advantageously, multiple input gain stages can be designed/built by interleaving input gain stages including p-type gain transistors and input gain stages including n-type gain transistors.

Figure 1:
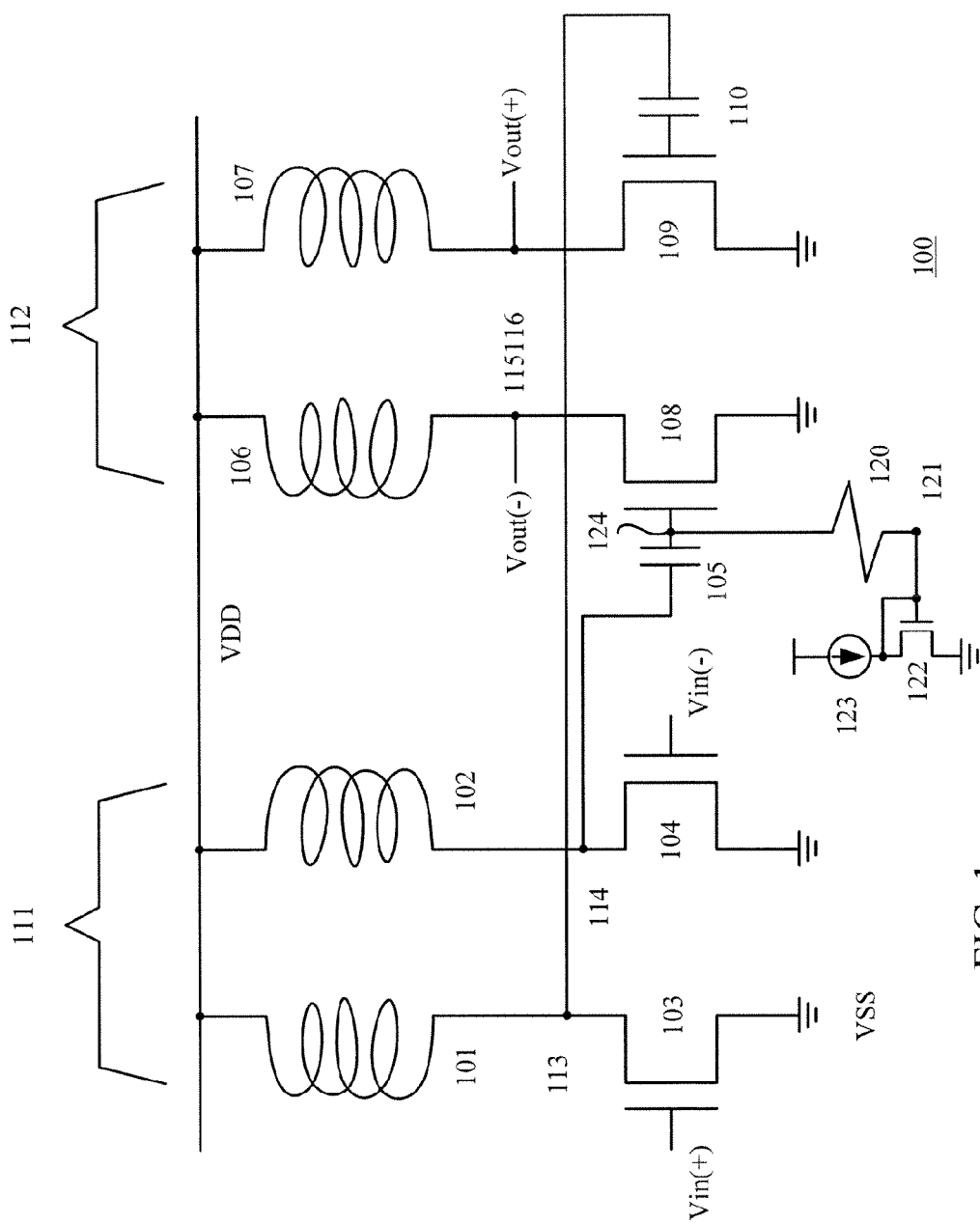
FIG. 1 illustrates a conventional two-stage RF amplifier with AC coupled RF gain stages.
Figure 2:
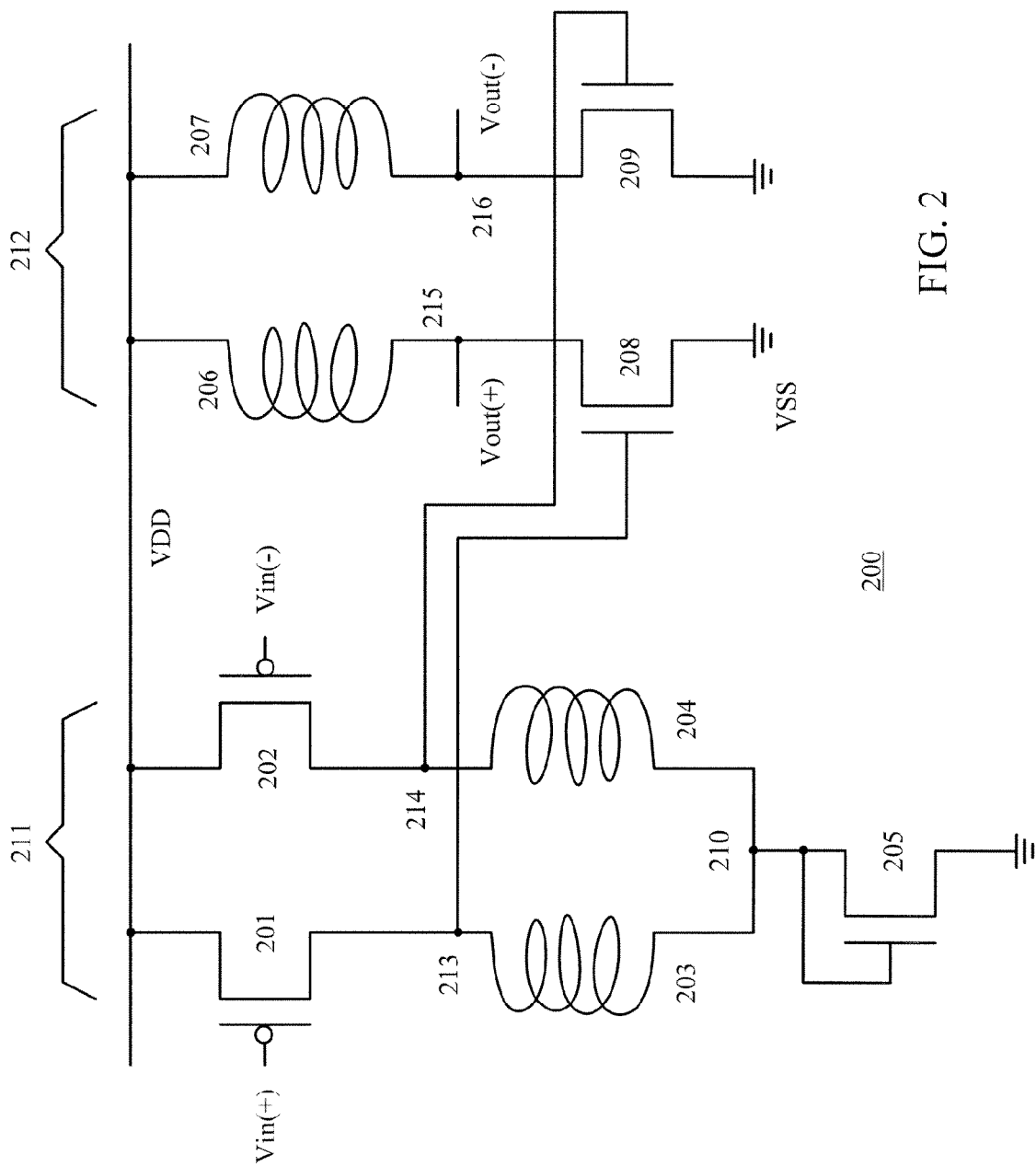
FIG. 2 illustrates a two-stage RF amplifier with DC coupled RF gain stages in accordance with one embodiment.

FIG. 2 illustrates an RF amplifier 200 with DC coupled RF gain stages. In RF amplifier 200, a first gain stage 211 includes a PMOS transistor 201 and an inductor 203 connected in series between a first voltage source VDD and a bias node 210. Bias node 210 is further connected to a second voltage source VSS via an NMOS transistor 205, wherein the gate and the drain of transistor 205 are connected to bias node 210. Transistor 201 receives the positive differential input signal Vin(+) on its gate. First gain stage 211 further includes a PMOS transistor 202 and an inductor 204 connected in series between first voltage source VDD and bias node 210. Transistor 202 receives the negative differential input signal Vin(−) on its gate.

In RF amplifier 200, a second gain stage 212 includes an inductor 206 and an NMOS transistor 208 connected in series between first voltage source VDD and second voltage source VSS. Node 215, which is located between inductor 206 and transistor 20e, provides the negative differential output signal Vout(−). Second gain stage 212 further includes an inductor 207 and an NMOS transistor 209 connected in series between first voltage source VDD and second voltage source VSS. Node 216, which is located between inductor 207 and transistor 209, provides the positive differential output signal Vout(+).

Advantageously, RF amplifier 200 avoids AC coupling and its problems. Specifically, a node 213 between transistor 201 and inductor 203 is connected directly to the gate of transistor 208. Similarly, a node 214 between transistor 202 and inductor 204 is connected directly to the gate of transistor 209. Thus, first gain stage 211 and second gain stage 212 are DC (not AC) coupled.

Notably, by using an appropriately sized bias transistor 205, the connection between the gain stages can be biased. Specifically, bias transistor 205 can advantageously track the behavior of the NMOS transconductance devices of second gain stage 212, i.e. approximately mirroring the bias current of first gain stage 211 to second gain stage 212.

In this configuration, first and second gain stages 211 and 212 are no longer biased independently However, the bias of second gain stage 212 can be adjusted for the given bias current of first gain stage 211 by adjusting the size of bias transistor 205. For example, by making bias transistor 205 smaller, a larger gate-to-source voltage develops, thereby generating a higher current. The size of bias transistor 205 can be determined based on the desired gain of second gain stage 212 (or, in general, the size of the bias transistor can be based on the desired gain of the next gain stage).

Note that some limited gain reduction may occur because of the lower mobility of transistors 201/202 (i.e. the use of PMOS devices instead of NMOS devices). Additionally, linearity may be somewhat reduced at high voltage swings because the headroom has been reduced by the voltage drop across bias transistor 205. However, from a cost-benefit analysis, the advantages of DC (rather than AC) coupling outweigh the minor limitations that can result from this configuration.

Figure 3:
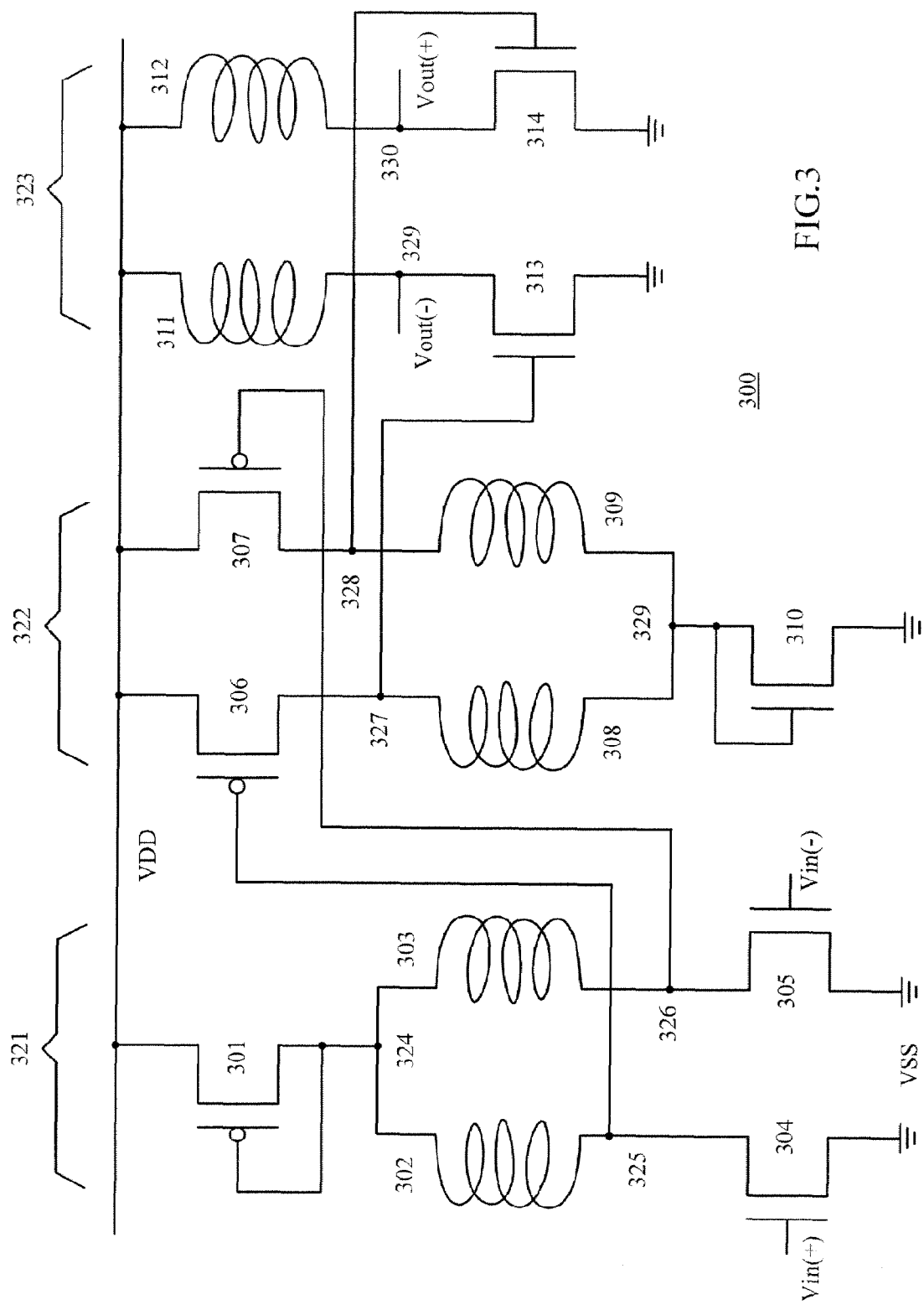
FIG. 3 illustrates an N-stage RPF amplifier with DC coupled RF gain stages, wherein N=3.

FIG. 3 illustrates an N-stage RF amplifier 300 with DC coupled RF gain stages. In this embodiment, RF amplifier has 3 gain stages (i.e. a first gain stage 321, a second gain stage 322, and a third gain stage 323), although an RF amplifier in accordance with the present invention could include any number of gain stages. As described in further detail below, each gain stage other than the output gain stage has a flipped location (i.e. connected to VDD or VSS) and type (e.g. NMOS or PMOS) of the bias transistor compared to an adjacent gain stage.

In RF amplifier 300, first gain stage 321 includes a PMOS (bias) transistor 301 connected between a voltage source VDD and a bias node 324, wherein the gate and the drain of bias transistor 301 are connected to bias node 324. First gain stage 321 further includes an inductor 302 and an AMOS transistor 304 connected in series between bias node 324 and a second voltage source VSS. First gain stage 321 yet further includes an inductor 303 and an NMOS transistor 305 connected in series between bias node 324 and second voltage source VSS. The gates of transistors 304 and 305 receive the differential input signals Vin(+) and Vin(−), respectively.

Second gain stage 322 includes a PMOS transistor 306 and an inductor 308 connected in series between first voltage source VDD and a bias node 329. Bias node 329 is further connected to second voltage source VSS via an NMOS (bias) transistor 310, wherein the gate and the drain of bias transistor 310 are connected to bias node 329. Second gain stage 322 further includes a PMOS transistor 307 and an inductor 309 connected in series between first voltage source VDD and bias node 329.

Third (output) gain stage 323 includes an inductor 311 and an NMOS transistor 313 connected in series between first voltage source VDD and second voltage source VSS. Node 329, which is between inductor 311 and transistor 313, provides negative differential output signal Vout(−). Third gain stage 323 further includes an inductor 312 and an NMOS transistor 314 connected in series between first voltage source VDD and second voltage source VSS. Node 330, which is located between inductor 312 and transistor 314, provides positive differential output signal Vout(+).

In RF amplifier 300, a node 325 between inductor 302 and transistor 304 is connected to the gate of transistor 306. A node 326 between inductor 303 and transistor 305 is connected to the gate of transistor 307. A node 327 between transistor 306 and inductor 308 is connected to the gate of transistor 313. A node 328 between transistor 307 and inductor 309 is connected to the gate of transistor 314. Thus, RF amplifier 300 provides DC coupling between its gain stages.

As mentioned above, each gain stage of RF amplifier 300 other than output gain stage 323 has a flipped location (i.e. connected to VDD or VSS) and type (e.g. NMOS or PMOS) of both the bias and gain transistors compared to an adjacent gain stage. Specifically, each input gain stage (i.e. any gain stage other than the output gain stage) can include either PMOS gain transistors (and an NMOS bias transistor) or NMOS gain transistors (and a PMOS bias transistor). For example, if the input gain stage includes PMOS drivers connected to VDD, then the bias transistor is an NMOS device connected to VSS. On the other hand, if the input gain stage includes NMOS drivers connected to VSS, then the bias transistor is a PMOS device connected to VDD.

Thus, in general, each gain stage with a first gain transistor type has an adjacent gain stage with a second gain transistor type. For example, if a four-stage RF amplifier was desired, then the first gain stage could include p-type gain transistors, the second gain stage could include n-type gain transistors, the third gain stage could include p-type gain transistors, and the fourth (output) gain stage could include n-type gain transistors. Note that because the bias transistor of the gain stage has an opposite type than the gain transistors, each gain stage with a first bias transistor type also has an adjacent gain stage with a second bias transistor type.

Moreover, although CMOS amplifiers are described above, DC coupled gain stages can also be implemented with bipolar devices. For example, PMOS transistors could be replaced with pnp transistors, and NMOS transistors could be replaced with npn transistors. Therefore, a "p-type" transistor could refer to a PMOS or pnp transistor. Similarly, an "n-type" transistor could refer to an NMOS or npn transistor.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

For example, in one embodiment of a bipolar RF amplifier output gain stage 400 shown in FIG. 4A, capacitive neutralization using capacitors 401 and 402 (capacitor 401 being connected between the gate of npn gain transistor 403 and the drain of npn gain transistor 404, and capacitor 402 being connected between the gate of npn gain transistor 404 and the drain of npn gain transistor 403) can be used to cancel any parasitic capacitive feedback associated with gain transistors 403 and 404, thereby ensuring stability in high frequency applications.

Another embodiment of such capacitive neutralization is provided in RF amplifier output gain stage 410, illustrated in FIG. 4B, using capacitors 405 and 407 as parasitic transistor capacitors and capacitors 406 and 408 as neutralization capacitors used to counteract the effect of parasitic transistors 405 and 407 (wherein capacitors 405 and 407 are connected between the gates and drains of NMOS gain transistors 409 and 410, respectively, capacitor 406 is connected between the gate of gain transistor 409 and the drain of gain transistor 410, and capacitor 408 is connected between the gate of gain transistor 410 and the drain of gain transistor 409). In yet another embodiment, a CMOS RF amplifier Output stage 420, as shown in FIG. 4C, can also include cascoded transistors 411 and 412, wherein transistor 411 can be connected between inductor 311 and transistor 313 and transistor 412 can be connected between inductor 312 and transistor 314. In this configuration, cascoded transistors 411 and 412 can receive a fixed bias voltage on their gates.

Note that the described DC coupling technique can be equally applied to cascoded, linear, and switching power amplifiers.

Accordingly, it is intended that the scope of the invention be defined by the following Claims and their equivalents.

The invention claimed is:

1. An RF amplifier including N gain stages, the RF amplifier comprising:
   an Nth gain stage including:
      a first inductor and a first gain transistor connected in series between a first voltage source and a second voltage source; and
      a second inductor and a second gain transistor connected in series between the first voltage source and the second voltage source; and
   an N−1 gain stage including:
      a third gain transistor and a third inductor connected in series between the first voltage source and a first bias node;
      a fourth gain transistor and a fourth inductor connected in series between the first voltage source and the first bias node; and
   a first bias transistor connected between the first bias node and the second voltage source, the first bias transistor having a gate connected to the first bias node,
   wherein the first gain transistor, the second gain transistor, and the first bias transistor are first type transistors,
   wherein the third gain transistor and the fourth gain transistor are second type transistors,
   wherein a first node between the first inductor and the first gain transistor provides a negative differential output signal, wherein a second node between the second inductor and the second gain transistor provides a positive differential output signal, wherein a third node between the third gain transistor and the third inductor directly drives a gate of the first gain transistor, and wherein a fourth node between the fourth gain transistor and the fourth inductor directly drives a gate of the second gain transistor.

2. The RF amplifier of claim 1, wherein if N=2, then a positive differential input signal is provided to a gate of the third gain transistor and a negative differential input signal is provided to a gate of the fourth gain transistor.

3. The RF amplifier of claim 1, further comprising an N−2 gain stage including:
a fifth inductor and fifth gain transistor connected in series between a second bias node and the second voltage source;
a sixth inductor and a sixth gain transistor connected in series between the second bias node and the second voltage source; and
a second bias transistor connected between the second bias node and the first voltage source, the second bias transistor having a gate connected to the second bias node,
wherein the fifth gain transistor and the sixth gain transistor are first type transistors,
wherein the second bias transistor is a second type transistor,
wherein a fifth node between the fifth inductor and the fifth gain transistor drives a gate of the third gain transistor, and
wherein a sixth node between the sixth inductor and the sixth gain transistor drives a gate of the fourth gain transistor.

4. The RF amplifier of claim 3, wherein if N=3, then a positive differential input signal is provided to a gate of the fifth gain transistor and a negative differential input signal is provided to a gate of the sixth gain transistor.

5. The RF amplifier of claim 3, wherein additional gain stages alternate between inductor/transistor configurations associated with the N−1 gain stage and the N−2 gain stage.

6. An RF amplifier having a plurality of stages, the RF amplifier comprising:
an output gain stage comprising:
a first inductor/transistor set connected between a first voltage source and a second voltage source; and
a second inductor/transistor set connected between the first voltage source and the second voltage source; and
another gain stage comprising:
a third inductor/transistor set connected between a first bias node and the first voltage source;
a fourth inductor/transistor set connected between the first bias node and the first voltage source; and
a bias transistor connected between the first bias node and the second voltage source, the bias transistor having its gate and drain connected to the first bias node,
wherein the first inductor/transistor set and the second inductor/transistor set provide differential output signals, and
wherein the third inductor/transistor set and the fourth inductor/transistor set directly drive gates associated with the first inductor/transistor set and the second inductor/transistor sets.

7. The RF amplifier of claim 6, wherein if the RF amplifier is a two-stage amplifier, then differential input signals are provided to gates associated with the third inductor/transistor set and the fourth inductor/transistor set.

8. The RF amplifier of claim 6, further comprising yet another gain stage including:
a fifth inductor/transistor set connected in series between a second bias node and the second voltage source;
a sixth inductor/transistor set connected in series between the second bias node and the second voltage source; and
a second bias transistor connected between the second bias node and the first voltage source,
wherein the fifth inductor/transistor set and the sixth inductor/transistor set directly drive gates associated with the third inductor/transistor set and the fourth inductor/transistor set.

9. The RF amplifier of claim 8, wherein if the RF amplifier is a three-stage amplifier, then differential input signals are provided to gates associated with the fifth inductor/transistor set and the sixth inductor/transistor set.

10. The RF amplifier of claim 8, wherein additional gain stages alternate between inductor/transistor set configurations associated with the other gain stage and the yet other gain stage.

11. An RF amplifier including a plurality of gain stages, the RF amplifier comprising:
an output gain stage; and
an input gain stage maintaining DC coupling to the output gain stage,
wherein if the RF amplifier includes a plurality of input gain stages, then
a first input gain stage includes first type gain transistors and an second type bias transistor, and
a second input gain stage, which is DC coupled to the first input stage, includes second type gain transistors and a first type bias transistor.

12. The RF amplifier of claim 11, wherein the output gain stage includes capacitive neutralization to cancel capacitive feedback.

13. The RF amplifier of claim 11, wherein the output gain stage includes cascoded amplifiers to cancel capacitive feedback.

14. A method of providing an RF amplifier, the method comprising:
providing an output gain stage;
providing at least one input gain stage, wherein each input gain stage includes one of a first input gain stage and a second input gain stage,
wherein the first input gain stage includes:
a first gain transistor and a first inductor connected in series between a first voltage source and a first bias node, the first inductor being between the first gain transistor and the first bias node;
a second gain transistor and a second inductor connected in series between the first voltage source and the first bias node, the second inductor being between the second gain transistor and the first bias node; and
a first bias transistor connected between the first bias node and a second voltage source, the first bias transistor having a gate connected to the first bias node,
wherein the second input gain stage includes:
a third gain transistor and a third inductor connected in series between the second voltage source and a second bias node, the third inductor being between the third gain transistor and the second bias node;
a fourth gain transistor and a fourth inductor connected in series between the second voltage source and the second bias node, the fourth inductor being between the fourth gain transistor and the second bias node; and a second bias transistor connected between the second bias node and the first voltage source, the second bias transistor having a gate connected to the second bias node; and DC coupling any gain stage to an adjacent gain stage.

15. A method of providing an RF amplifier, the method comprising:

providing an output gain stage;

providing at least one input gain stage, wherein each input gain stage includes one of a first input gain stage and a second input gain stage, wherein the first input gain stage includes:
 a first gain transistor and a first inductor connected in series between a first voltage source and a first bias node;
 a second gain transistor and a second inductor connected in series between the first voltage source and the first bias node; and
 a first bias transistor connected between the first bias node and a second voltage source, wherein the second input gain stage includes:
 a third gain transistor and a third inductor connected in series between the second voltage source and a second bias node;
 a fourth gain transistor and a fourth inductor connected in series between the second voltage source and the second bias node; and
 a second bias transistor connected between the second bias node and the first voltage source; and DC coupling any gain stage to an adjacent gain stage, wherein multiple input gain stages alternate stacking the first input gain stage and the second input gain stage.

16. The method of claim 15, further including canceling capacitive feedback in the output gain stage by capacitive neutralization.

17. The method of claim 15, further including canceling capacitive feedback in the output gain stage by using cascoded transistors.

* * * * *